(12) United States Patent
Atanakovic

(10) Patent No.: US 7,586,177 B2
(45) Date of Patent: Sep. 8, 2009

(54) SEMICONDUCTOR-ON-INSULATOR SILICON WAFER

(75) Inventor: Petar B. Atanakovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 83 days.

(21) Appl. No.: 11/745,678

(22) Filed: May 8, 2007

(65) Prior Publication Data

US 2007/0205463 A1      Sep. 6, 2007

Related U.S. Application Data

(62) Division of application No. 11/054,579, filed on Feb. 9, 2005, now Pat. No. 7,217,636.

(51) Int. Cl.
    *H01L 23/58*   (2006.01)
(52) U.S. Cl. .............. 257/640; 257/18; 257/E27.112; 257/E29.287; 257/E21.32; 257/E21.545; 257/E21.561
(58) Field of Classification Search .......... 257/347, 257/18, 637, 640, E21.32, E21.545, E21.561, 257/E27.112, E29.287; 438/311, 455
See application file for complete search history.

(56) References Cited

U.S. PATENT DOCUMENTS

| 6,661,065 B2 * | 12/2003 | Kuniyo | 257/411 |
| 6,949,451 B2 * | 9/2005 | Yeo et al. | 438/479 |
| 2005/0282318 A1 * | 12/2005 | Dao | 438/151 |

* cited by examiner

*Primary Examiner*—Quoc D Hoang
(74) *Attorney, Agent, or Firm*—Parsons & Goltry; Robert A. Parsons; Michael W. Goltry

(57) ABSTRACT

A method of fabricating a semiconductor-on-insulator semiconductor wafer is described that includes providing first and second semiconductor substrates. A first insulating layer is formed on the first substrate with a first predetermined stress and a second insulating layer is formed on the second substrate with a second predetermined stress different than the first predetermined stress. The first insulating layer is bonded to the second insulating layer to form a composite insulating layer bonding the first substrate to the second substrate and a portion of the one substrate is removed to form a thin crystalline active layer on the composite insulating layer. The first and second insulating layers are formed with different stresses to provide a desired composite stress, which can be any stress from compressive to unstressed to tensile, depending upon the desired application.

5 Claims, 5 Drawing Sheets

| FILM | PROCESS | FILM STRESS | FILM STRESS ON Si SUBSTRATE |
|---|---|---|---|
| $SiO_2$ | THERMAL | COMPRESSIVE | −0.2 to −0.3 GPA |
| $SiO_2$ | CVD | TENSILE | +0.15 GPA |
| $SiO_2$ | TEO 5 | TENSILE | +0.38 GPA |
| $Si_3N_4$ | CVD | TENSILE | +0.8 to +1.2 GPA |
| $Si_3N_4$ | PLASMA | COMPRESSIVE | −0.7 GPA |
| $Si_3N_4$ | SPUTTERED | COMPRESSIVE | −0.1 to −0.5 GPA |
| POLY Si | LPCVD | COMPRESSIVE | −0.1 to −0.3 GPA |
| $TiSi_2$ | SPUTTERED | TENSILE | +2.3 GPA |
| $CoSi_2$ | SPUTTERED | TENSILE | +1.3 GPA |
| $TaSi_2$ | SPUTTERED | TENSILE | +1.2 to +3.2 GPA |

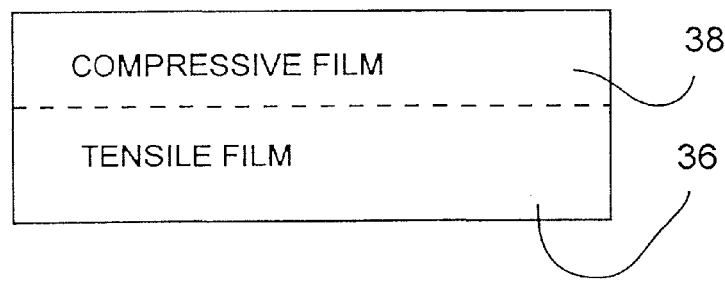

FIG. 7

SEMICONDUCTOR-ON-INSULATOR SILICON WAFER

CROSS-REFERENCE TO RELATED APPLICATIONS

This application is a divisional application of currently U.S. application Ser. No. 11/054,579, filed 9 Feb. 2005.

FIELD OF THE INVENTION

This invention relates to crystalline semiconductor on an insulator layer for use in the semiconductor industry.

BACKGROUND OF THE INVENTION

In the semiconductor industry it is common to form a layer of crystalline silicon (generally referred to as an active layer) on an insulating layer to reduce any effects or interactions between the substrate (or handle wafer) on one side of the insulating layer and components formed on or in the crystalline layer on the other side of the insulating layer. At the present time the preferred insulating layer is formed of silicon dioxide ($SiO_2$) because of the ease in forming the layer and because bonding between the silicon dioxide and the silicon of the handle wafer is easy to achieve. In this disclosure the term "crystalline silicon" is used to denote a layer of silicon that is substantially single crystal material, i.e. as much of a single crystal as can be formed using present day techniques.

One common method of forming a silicon dioxide insulating layer between a substrate and a crystalline silicon layer is to provide two silicon substrates and form a layer of silicon dioxide on the surface of one of the substrate. At present the film of silicon dioxide is almost always formed by thermal oxidation, i.e. heating the substrate in a high humidity (such as steam). The silicon dioxide surface is then brought into contact with the surface of the second silicon substrate and forms a molecular bond through a well known process, referred to in the industry as Van der Waal's bonding. One of the substrates is then partially removed by any of several different methods to leave a thin crystalline layer of silicon on the silicon dioxide layer. This in effect forms a buried oxide (BOX) insulator layer.

One method of removing a substantial portion of the substrate is to implant hydrogen, which is then annealed to form a weakened fracture plane. The substrate is then cleaved at the fracture plane and the surface is polished to a mirror surface using well known chemical mechanical polishing (CMP) techniques. Some methods have been introduced to improve the cleaving and polishing, see for example U.S. Pat. No. 6,372,609, entitled "Method of Fabricating SOI Wafer by Hydrogen ION Delamination Method and Wafer Fabricated by the Method", issued Apr. 16, 2002.

One problem with the crystalline silicon on a silicon dioxide insulating layer is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. Some components can be formed in the crystalline layer that use this compressive stress to an advantage, however, since the compressive stress will be across the entire wafer it will affect all components formed in/on the crystalline layer, many to a highly undesirable degree. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). However, the result is a layer of silicon dioxide that is too thick to be of use in many applications, such as gate oxides in very small field effect transistors and the like.

Also, because the silicon dioxide layer allows some migration of impurities into the active layer from the substrate (handle wafer) both of the substrates must be high quality wafers, which adds substantial expense. Further, the silicon dioxide may contain impurities (e.g. hydrogen molecules introduced during the oxidation process) that can migrate into the active layer.

It would be highly advantageous, therefore, to remedy the foregoing and other deficiencies inherent in the prior art.

Accordingly, it is an object of the present invention to provide new and improved semiconductor-on-insulator semiconductor wafers.

Another object of the invention is to provide a new and improved semiconductor-on-insulator semiconductor wafer with a stress engineered insulative/active layer to produce an active layer with a desired amount of compressive stress, a desired amount of tensile stress, or no stress.

Another object of the invention is to provide new and improved semiconductor-on-insulator semiconductor wafers that can be formed very thin.

And another object of the invention is to provide new and improved semiconductor-on-insulator semiconductor wafers with an insulating layer that prevents impurities from migrating into the active layer.

Still another object of the present invention is to provide new and improved semiconductor-on-insulator semiconductor wafers that can be formed with a less expensive handle wafer.

SUMMARY OF THE INVENTION

Briefly, to achieve the desired objects of the instant invention in accordance with a preferred embodiment thereof, provided is a method of fabricating a semiconductor-on-insulator semiconductor wafer that includes providing first and second semiconductor substrates. A first insulating layer is formed on the first substrate with a first predetermined stress and a second insulating layer is formed on the second substrate with a second predetermined stress different than the first predetermined stress. The first insulating layer is bonded to the second insulating layer to form a composite insulating layer bonding the first substrate to the second substrate and a portion of the one substrate is removed to form a thin crystalline active layer on the composite insulating layer. The first and second insulating layers are formed with different stresses (e.g. compressive and tensile) to provide a desired composite stress, which can be any stress from compressive to unstressed to tensile, depending upon the desired application.

A semiconductor-on-insulator semiconductor wafer formed by the new method includes first and second semiconductor substrates with a first insulating layer on the first semiconductor substrate and a second insulating layer on the second semiconductor substrate. The first insulating layer is bonded to the second insulating layer to form a composite insulating layer bonding the first semiconductor substrate to the second semiconductor substrate and a portion of one of the semiconductor substrates is removed to form a thin crystalline active layer on the composite insulating layer.

The first insulating layer has a first predetermined stress and the second insulating layer has a second predetermined stress different than the first predetermined stress. For example, the first insulating layer may have a compressive stress and the second insulating layer may be formed with a tensile stress substantially equal and opposite to the compressive stress. By properly selecting the insulating material, the process used to form the layers, and the thickness of the layers the composite stress of the composite insulating layer can be any stress from compressive to unstressed to tensile, depending upon the desired application.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 7 is a side view of a pair of stressed insulating layers illustrating some representative stresses that can be incorporated for stress engineering;

DETAILED DESCRIPTION OF A PREFERRED EMBODIMENT

Figure 1:
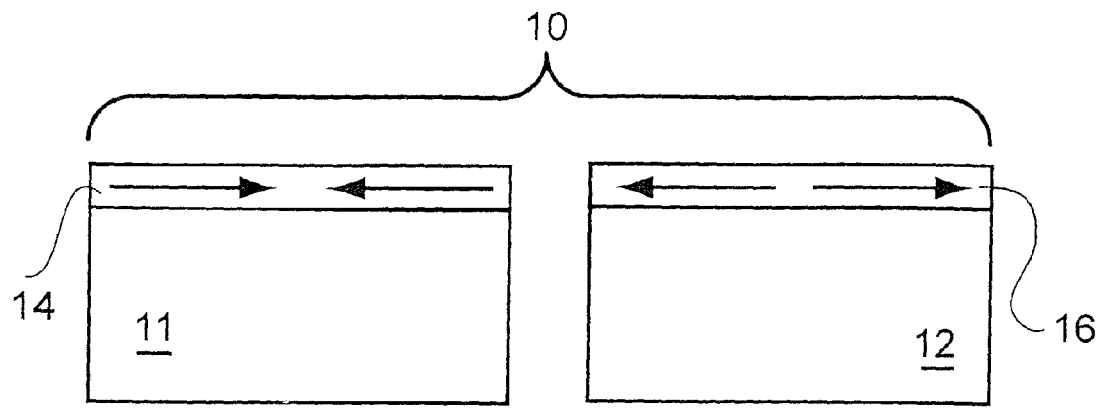
FIG. 1 is a simplified side view of a pair of semiconductor substrates illustrating an interim point in a silicon-on-insulator (SOI) fabrication process in accordance with the present invention.

Turning now to the drawings in which like reference characters indicate corresponding elements throughout the several views, attention is first directed to FIG. 1, which illustrates a simplified side view of an interim point in a fabrication process in accordance with the present invention. Illustrated in FIG. 1 is a first silicon substrate 11 and a second silicon substrate 12, which are basic components of a silicon-on-insulator (SOI) wafer 10. As will be understood from the following description, substrate 11 is referred to as the handle substrate and substrate 12 is processed to produce an active layer of crystalline silicon. Under normal manufacturing procedures both substrates 11 and 12 are silicon wafers, although any size substrate or portion of a wafer could be used in the following procedures, if desired and all such substrates and portions may be referred to herein as a 'wafer' for convenience of understanding.

As shown in FIG. 1, substrate 11 has been processed to produce a layer 14 of thermal silicon dioxide ($SiO_2$) on one surface thereof. The thermal process can be any well known process and includes any steps used to produce layer 14 with a desired thickness. As is understood by those skilled in the art, thermal oxides grow at a regular and well known rate so that careful monitoring of the oxide formation easily grows layers that can be controlled to nanometers. Also, substrate 12 has been processed to produce, in this preferred embodiment, a layer 16 of silicon oxynitride ($Si_xO_yN_z$) on one surface thereof. The values of x, y, and z are determined by the process used to produce the layer, with x being an integer from 1 to 3, y being either 0 or 1, and z ranging from 1 to 4. Here it will be clear that layer 16 could simply be silicon nitride ($Si_xN_z$) with no oxygen present (y=0). Either of the terms "silicon oxynitride" or $Si_xO_yN_z$ are used in this disclosure generically to designate layer 16, even though oxide may not be present. In this embodiment silicon oxynitride layer 16 is also a thermal layer that can be produced using any of a variety of processes.

Several processes that could be used to produce layer 16 include implanting and growing by any of the well known processes, some examples of which are explained below. In a first process, a layer of silicon dioxide is formed on the surface of substrate 12 and nitrogen (N+) is implanted into the silicon dioxide layer to form silicon oxynitride (SiON). Conversely, nitrogen (N+) can be implanted into the silicon surface of substrate 12 and a layer (16) can then be oxidized to form silicon oxynitride (SiON). Another potential process for forming layer 16 includes growing SiON directly using nitrous oxide ($N_2O$) or co-depositing with Si or $SiH_2$ in O and N species. This process can use any standard deposition (growing) procedure to form SiON (e.g. CVD, TEOS, plasma, sputtered, etc.). Another potential process for forming layer 16 includes growing crystalline silicon nitride ($Si_xN_z$) directly on the silicon surface of substrate 12, generally resulting in the growth of $Si_3N_4$. Again, this process can use any standard deposition (growing) procedure to form SiON (e.g. CVD, TEOS, plasma, sputtered, etc.), depending upon the specific stress desired. In a further potential process for forming layer 16, a layer of crystalline silicon nitride ($Si_xN_z$) is grown directly on the surface of substrate 12 and then oxidized to form layer 16 of silicon oxynitride ($Si_xO_yN_z$). As will be explained in more detail presently, the specific process and materials used depends on the amount and type of stress to be engineered into the product.

In this embodiment, thermal silicon dioxide layer 14 has a natural compressive stress, illustrated by arrows pointing inwardly in layer 14, when formed on crystalline silicon caused by a lattice mismatch. Thermal silicon oxynitride layer 16 has a natural tensile stress, illustrated by arrows pointing outwardly in layer 16, when formed on crystalline silicon caused by a lattice mismatch. It will be understood from the following description that the amount of stress, either compressive or tensile, depends upon the material used in the layer (i.e. the amount of lattice mismatch with silicon and the stress produced by the mismatch), the thickness of the layer, and the process used in forming the layer.

Figure 2:
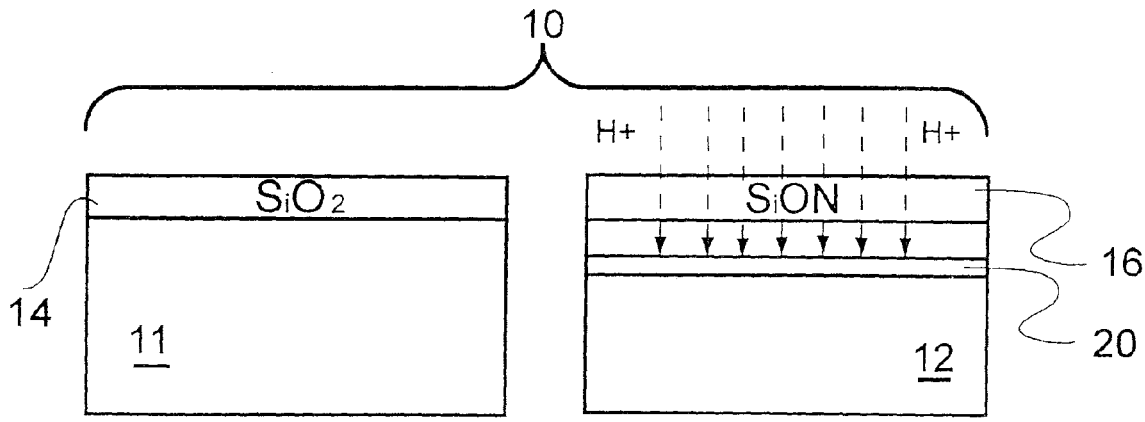
FIG. 2 is a view similar to FIG. 1 illustrating another step in the SOI fabrication process.

Referring to FIG. 2, hydrogen is implanted into substrate 12 to form a layer 20 spaced below layer 16 a specified distance. It will be understood by those skilled in the art that the distance layer 20 is below layer 16 is determined by the implant energy used. Also, it will be understood that the portion of substrate 12 between layers 16 and 20 will ultimately be the crystalline silicon active layer in/on which components are formed and, therefore, is generally very thin (e.g. generally in a range of 150 to 500 angstroms).

Figure 3:
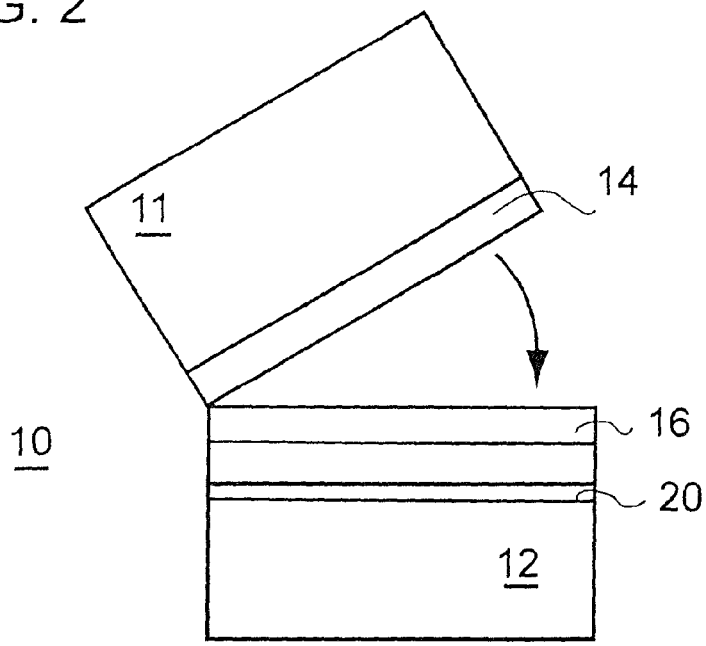
FIGS. 3, 4, and 5 are additional views of the semiconductor substrates of FIG. 1 illustrating additional steps in the SOI fabrication process.
Figure 4:
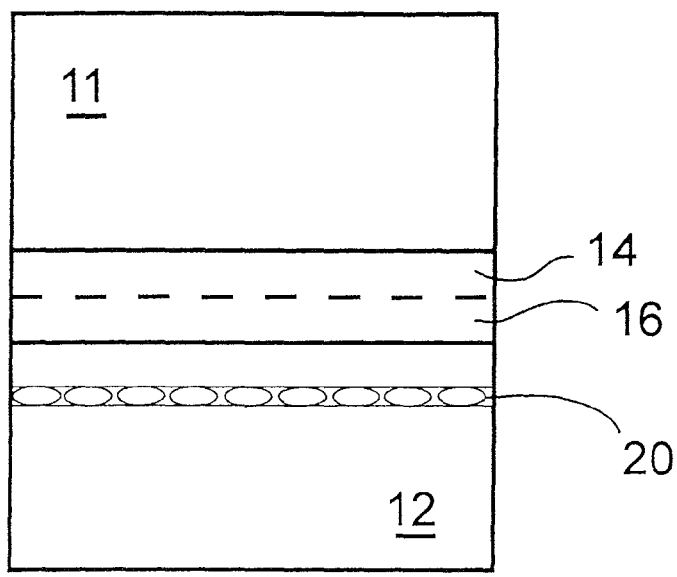

Referring additionally to FIG. 3, substrates 11 and 12 are placed in overlying relationship with the surface of silicon dioxide layer 14 in abutting engagement with the surface of silicon oxynitride layer 16. It will be understood that bringing the surfaces of layers 14 and 16 into engagement produces a natural molecular bonding, commonly referred to in the industry as Van der Waal's bonding. The combined substrates are then annealed at a temperature of approximately 1000 degrees Centigrade, which further enhances the bonding and forms blistering in hydrogen layer 20, as illustrated in simplified FIG. 4.

Figure 5:
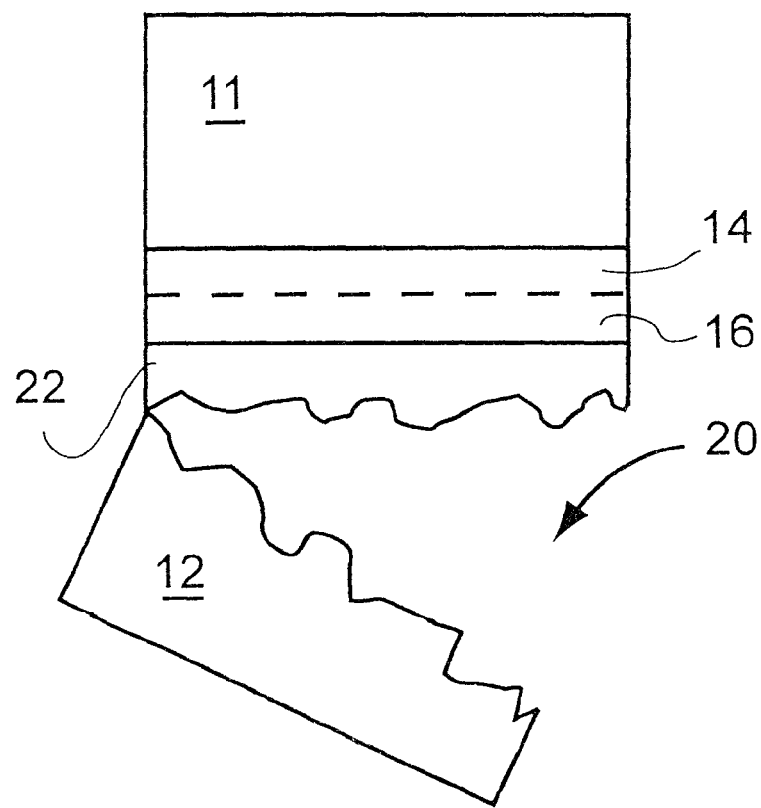

The blistering produces a weakened fracture plane, which can then be cleaved, as illustrated in FIG. 5, to remove all of substrate 12 except the active layer, designated 22 in FIG. 5. The surface of active layer 22 is then polished by any convenient method (e.g. CMP which denotes chemical-mechanical-polish) to produce a smooth surface. By engineering layers 14 and 16 to remove or substantially remove any stress in active layer 22, active layer 22 is freestanding (i.e. unstressed) and can, therefore be formed as thin as desired (e.g. in a range of 150 to 500 angstroms). That is, if active layer 22 were stressed by forming it only on a silicon dioxide layer it could not be treated as bulk silicon because it would be elastically deformed (i.e. strained) by the stress when the layer is too thin.

Figure 6:
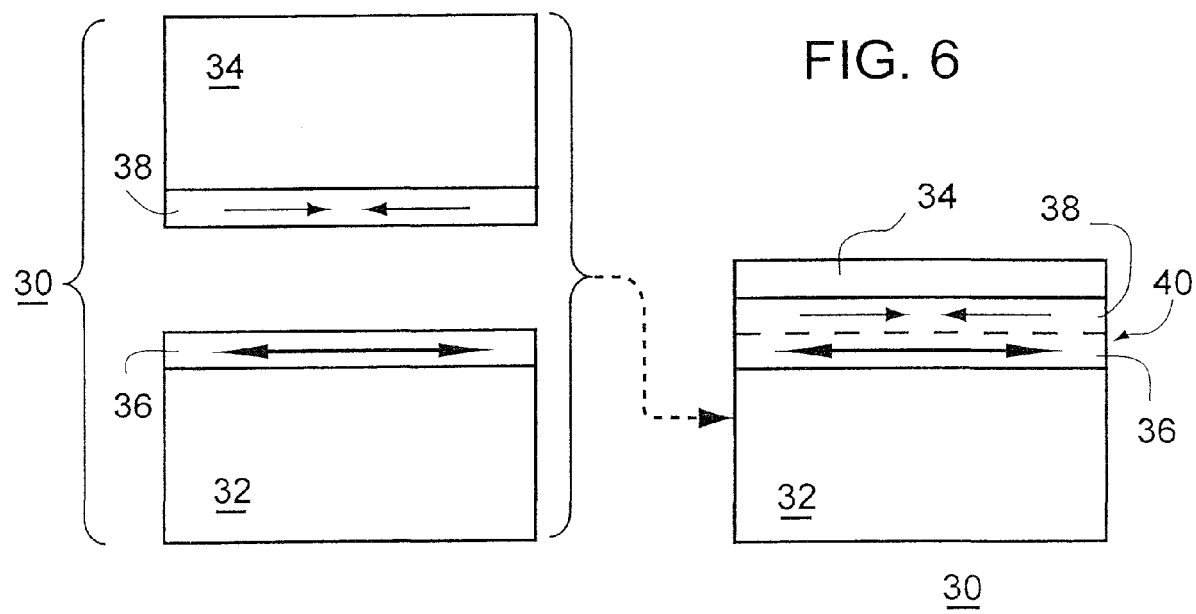
FIG. 6 is a side view of a pair of semiconductor substrates illustrating generically the stress engineering concept of the present invention.

Turning now to FIG. 6, a side view of a pair of semiconductor substrates illustrates generically the stress engineering concept of the present invention. A wafer 30 with an active semiconductor layer on an insulator layer, includes a first substrate 32 and a second substrate 34. Substrate 32 has an insulating layer or film 36 formed on a surface thereof with a tensile stress and substrate 34 has an insulating layer or film 38 formed on a surface thereof with a compressive stress. The surfaces of layers 36 and 38 are then bonded to form a composite layer 40 with a desired composite stress, which can be any stress from compressive to unstressed to tensile, depending upon the desired application. One of the substrates 32 or 34 (In this example substrate 34) is partially removed and the surface polished to form an active semiconductor layer on composite insulating layer 40.

The amount of stress, either compressive, unstressed, or tensile, in composite insulating layer 40 depends upon the materials used in individual layers 36 and 38 forming composite insulating layer 40 (i.e. the amount of lattice mismatch with the semiconductor substrates and the stress produced by the mismatch), the thickness of individual layers 36 and 38, and the process used in forming individual layers 36 and 38. A chart is illustrated as a portion of FIG. 7 to show examples of materials that can be used in individual layers 36 and 38 of composite layer 40. The first column of the chart lists materials that can be used in at least one of individual layers 36 and 38. The second column lists the process for forming the materials listed in column one, the third column lists the type of stress developed, and the fourth column lists the amount of stress. It will be noted that three silicides (i.e. $TiSi_2$, $CoSi_2$, and $TaSi_2$) are listed as formed by sputtering but can also be formed using commercial CMOS processes.

In addition to the materials listed in the chart of FIG. 7, some rare earth oxide, nitride, or phosphide layers or films (either single crystal or amorphous) may be included as a component in the composite insulating layer. Some typical examples of rare earth oxides, nitrides, and phosphides that can be used in this application are described in U.S. Provisional Application No. 60/533378, filed 29 Dec. 2003, incorporated herein by reference.

Figure 8:
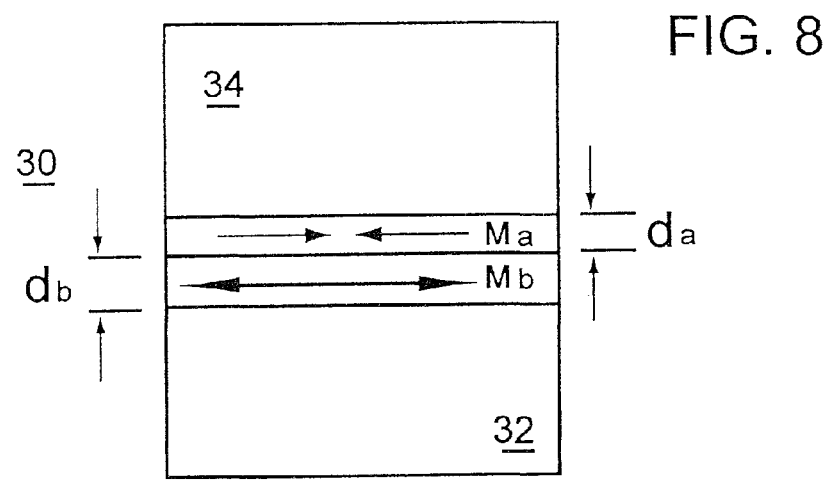
FIG. 8 is a side view of a pair of semiconductor substrates with stressed insulating layers therebetween illustrating thicknesses that can be incorporated for stress engineering.

Referring additionally to FIG. 8, wafer 30 with individual layers or films 36 and 38 bonded to form composite insulating layer 40, in accordance with the present invention, is illustrated. Layer 38 has a width designated $d_a$ and layer 36 has a width designated $d_b$. Layer 38 has a bulk modulus $M_a$ and layer 36 has a bulk modulus $M_b$. To provide a desired composite stress in composite insulating layer 40, the individual thicknesses ($d_a$ and $d_b$) required in each layer 36 and 38 can be calculated based on stress energy at the interface.

Figure 9:
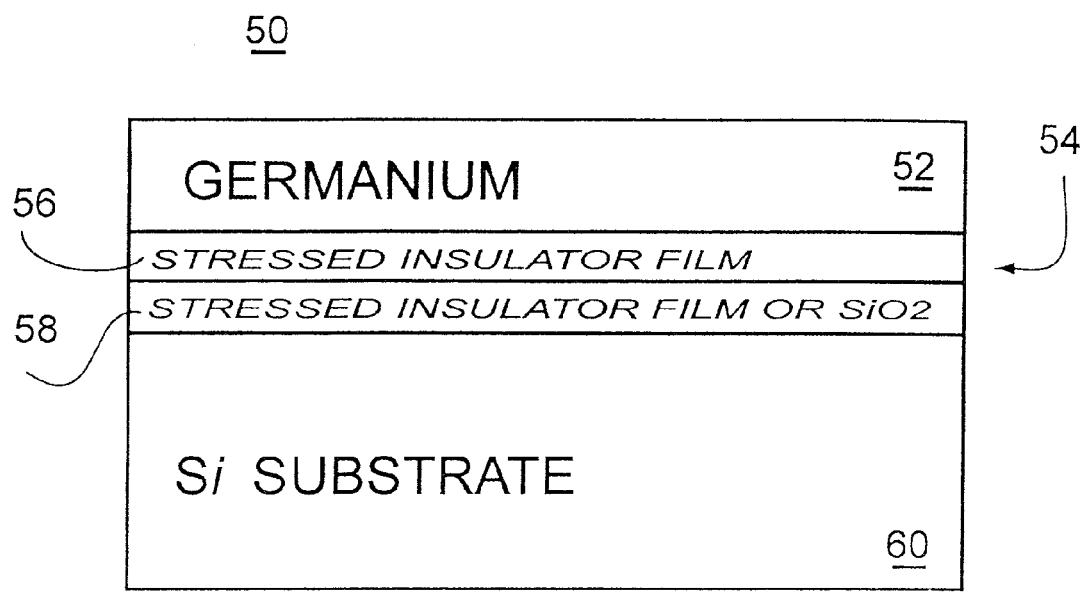
FIG. 9 is a side view of one example in which stress engineering is used to form a specific semiconductor product with different semiconductor wafers.

Referring to FIG. 9, a specific example of a wafer 50 including a crystalline semiconductor layer 52 on a composite insulating layer 54, in accordance with the present invention, is illustrated. It is known that germanium has a large thermal and lattice mismatch with silicon. However, in many applications it is desirable to provide crystalline germanium active layers on silicon substrates. In the present example, stressed insulating layer 56 of composite insulating layer 54 is formed on a germanium substrate and stressed insulating layer 58 is formed on a silicon substrate 60. Stressed insulating layers 56 and 58 are then bonded and a portion of the germanium substrate is removed to leave crystalline semiconductor layer 52 on composite insulating layer 54. Stressed insulating layers 56 and 58 are engineered (e.g. in this example highly stressed) to produce a desired composite stress, generally unstressed, in composite layer 54. In a preferred embodiment the materials of stressed insulating layers 56 and 58 are also chosen to reduce the thermal mismatch.

Thus, new and improved semiconductor-on-insulator semiconductor wafers have been disclosed. The new and improved semiconductor-on-insulator semiconductor wafers may be used, generally, in a large variety of semiconductor products. Because the composite insulating layer can be formed very thin and because it can include higher quality insulators, such as nitrides and rare earths, the wafers can be used to manufacture high quality and very small field effect transistors and the like. In the preferred embodiment, the insulating layer formed on the silicon substrate will contain silicon to provide a better lattice match. Also, if the insulating layer formed on the substrate ultimately resulting in the active crystalline semiconductor layer contains a nitride or a rare earth, impurity diffusion from the handle wafer is reduced or eliminated so that a lower quality handle wafer can be used, thereby resulting in substantially reduced cost. Further, by stress engineering a composite insulating layer, the thickness and/or roughness of the active layer can be substantially reduced and the active layer contains less dislocations, defects, fractures, etc.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A semiconductor-on-insulator semiconductor wafer comprising:
   a first semiconductor substrate;
   a first insulating layer including a first material selected from a group consisting of $SiO_2$, $Si_3N_4$, poly Si, and combinations thereof on a surface of the first semiconductor substrate, the first insulating layer having a first predetermined stress;
   a second semiconductor substrate;
   a second layer including a first material selected from a group consisting of $TiSi_2$, $CoSi_2$, $TaSi_2$, rare earth oxides, rare earth nitrides, rare earth phosphides, rare earth silicides, and combinations thereof on a surface of the second semiconductor substrate, the second layer having a second predetermined stress different than the first predetermined stress;

the first insulating layer being bonded to the second layer to form a composite insulating layer bonding the first semiconductor substrate to the second semiconductor substrate; and a portion of one of the first semiconductor substrate and the second semiconductor substrate being removed to form a thin crystalline active layer on the composite insulating layer.

2. A semiconductor-on-insulator semiconductor wafer as claimed in claim 1 wherein the first semiconductor substrate includes crystalline silicon and the second semiconductor substrate includes one of crystalline silicon and crystalline germanium.

3. A semiconductor-on-insulator semiconductor wafer as claimed in claim 2 wherein the first insulating layer includes $SiO_2$.

4. A semiconductor-on-insulator semiconductor wafer as claimed in claim 1 wherein the second semiconductor substrate includes a high quality silicon substrate and the first semiconductor substrate includes a lower quality silicon substrate and the second semiconductor substrate is removed to form the thin crystalline active layer on the composite insulating layer.

5. A semiconductor-on-insulator semiconductor wafer as claimed in claim 1 wherein the first predetermined stress of the first insulating layer includes compressive stress and the second predetermined stress of the second layer includes tensile stress approximately equal to the compressive stress in the first insulating layer.

* * * * *